(12) United States Patent
Skorka et al.

(10) Patent No.: US 11,036,067 B2
(45) Date of Patent: Jun. 15, 2021

(54) IMAGE SENSOR PACKAGES WITH TUNABLE POLARIZATION LAYERS

(71) Applicant: SEMICONDUCTOR COMPONENTS INDUSTRIES, LLC, Phoenix, AZ (US)

(72) Inventors: Orit Skorka, Santa Clara, CA (US); Brian Anthony Vaartstra, Nampa, ID (US); Radu Ispasoiu, Saratoga, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/715,090

(22) Filed: Dec. 16, 2019

(65) Prior Publication Data

US 2021/0026164 A1    Jan. 28, 2021

Related U.S. Application Data

(60) Provisional application No. 62/877,701, filed on Jul. 23, 2019, provisional application No. 62/914,254, filed on Oct. 11, 2019.

(51) Int. Cl.
*G02F 1/1335* (2006.01)
*G02F 1/1343* (2006.01)
(Continued)

(52) U.S. Cl.
CPC ......... *G02F 1/0136* (2013.01); *G02B 3/0006* (2013.01); *G02F 1/137* (2013.01);
(Continued)

(58) Field of Classification Search
CPC ......... H01L 27/14625; H01L 27/14627; H01L 31/0232; H01L 2224/48227;
(Continued)

(56) References Cited

U.S. PATENT DOCUMENTS 6,195,139 B1    2/2001   Yamazaki et al.
9,505,981 B2    11/2016  Chiou
(Continued)

FOREIGN PATENT DOCUMENTS

WO    2008147403 A1   4/2008
WO    2013044149 A1   3/2013

*Primary Examiner* — Thoi V Duong
(74) *Attorney, Agent, or Firm* — Treyz Law Group, P.C.; Joseph F. Guihan

(57) ABSTRACT

Imaging systems may include tunable polarization filters. A tunable polarization filter may be integrated directly into an image sensor package. For example, the tunable polarization filter may serve as cover glass for the image sensor package. Tunable polarization package glass may be incorporated into image sensor packages that have air gaps between the image sensor and the cover glass or that have transparent adhesive between the image sensor and the cover glass. The tunable polarization layer may be controlled at a global level, at a sub-array level, or at a pixel level. In some cases, the tunable polarization layer may be a tunable polarization filter. In this example, the direction of the polarization filter is tuned. In other cases, the tunable polarization layer may be a tunable polarization rotator. In this example, the tunable polarization layer selectively rotates the polarization of light that passes through the tunable polarization layer.

13 Claims, 8 Drawing Sheets

(51) Int. Cl.
*G02F 1/1339* (2006.01)
*G02F 1/01* (2006.01)
*G02F 1/137* (2006.01)
*G02B 3/00* (2006.01)
*H04N 5/225* (2006.01)

(52) U.S. Cl.
CPC ...... *G02F 1/1339* (2013.01); *G02F 1/133528* (2013.01); *G02F 1/134309* (2013.01); *H04N 5/2254* (2013.01); *G02F 1/133562* (2021.01); *G02F 1/133567* (2021.01)

(58) Field of Classification Search
CPC .... H04N 5/2254; G02B 3/006; G02F 1/0136; G02F 1/13; G02F 1/137; G02F 1/134309; G02F 1/133528; G02F 1/1339; G02F 1/133526; G02F 1/1323; G02F 1/1313; G02F 1/1335; G02F 1/1343; G02F 2001/133562; G02F 2001/133567
See application file for complete search history.

(56) References Cited

U.S. PATENT DOCUMENTS

| | | |
|---|---|---|
| 2003/0098918 A1 | 5/2003 | Miller |
| 2012/0307128 A1 | 12/2012 | Vorovitchik |
| 2016/0127661 A1* | 5/2016 | Hegyi ................. G02F 1/13 348/164 |
| 2016/0232875 A1* | 8/2016 | Drolet ................. G09G 5/026 |
| 2017/0276996 A1* | 9/2017 | Barbour ............... G01J 3/26 |
| 2018/0007760 A1* | 1/2018 | Ollila ................. H04N 5/33 |

* cited by examiner

IMAGE SENSOR PACKAGES WITH TUNABLE POLARIZATION LAYERS

This application claims the benefit of provisional patent application No. 62/877,701, filed Jul. 23, 2019, which is hereby incorporated by reference herein in its entirety. This application also claims the benefit of provisional patent application No. 62/914,254, filed Oct. 11, 2019, which is hereby incorporated by reference herein in its entirety.

BACKGROUND

This relates generally to imaging systems, and more specifically, to imaging systems having polarization filters.

Some image sensors may be used with polarization filters. Conventionally, the polarization filters are passive polarization filters that are formed external to the image sensor package or on the image sensor chip. However, imaging systems with passive polarization filters of this type lack versatility.

It would therefore be desirable to be able to provide improved imaging systems having polarization filters.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
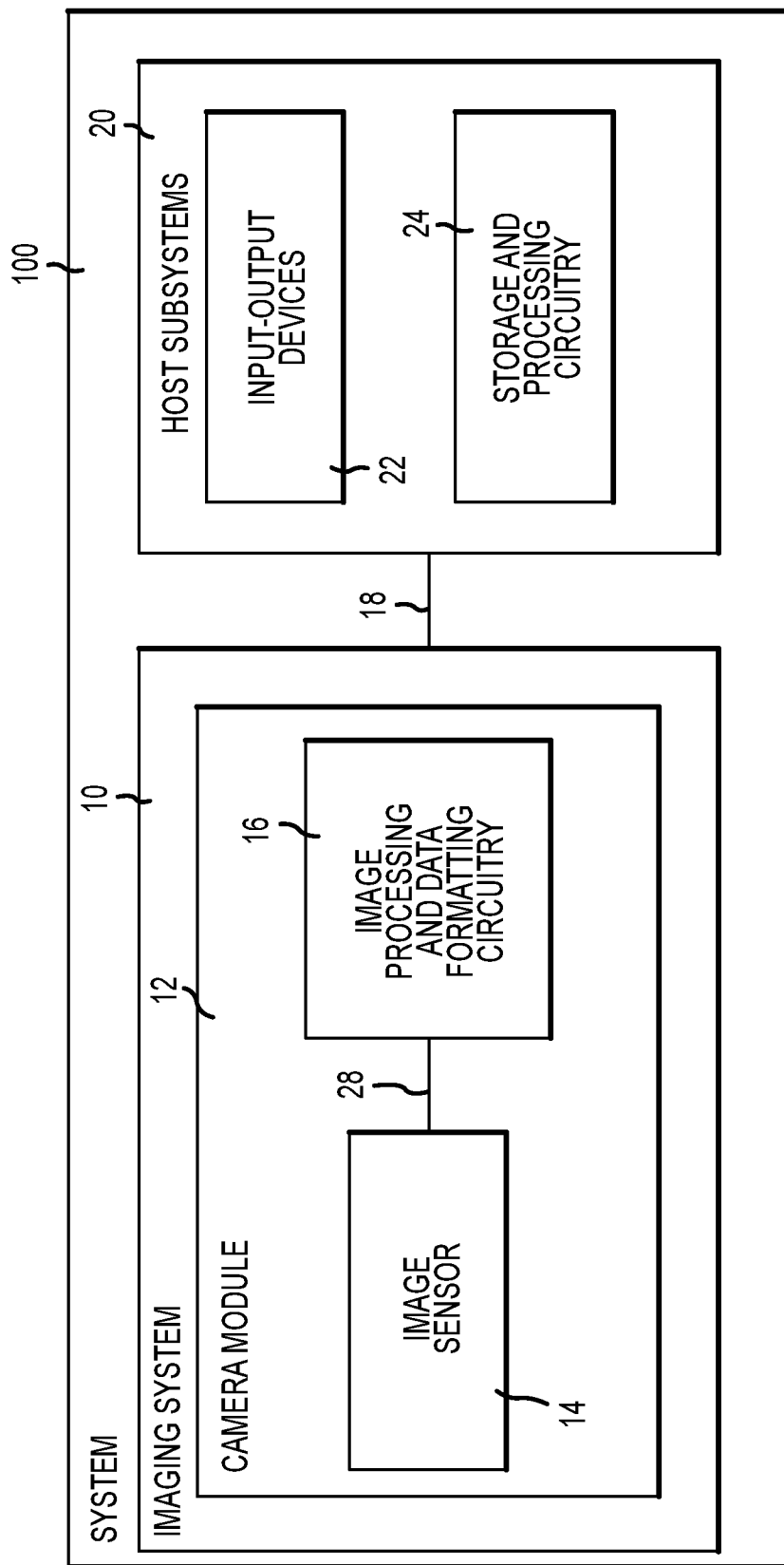
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

In a vehicle safety system, images captured by the image sensor may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), a pedestrian detection system, etc. In at least some instances, an image sensor may form part of a semi-autonomous or autonomous self-driving vehicle. System 100 may also be used for medical imaging, surveillance, and general machine vision applications.

As shown in FIG. 1, system 100 may include an imaging system such as imaging system 10 and host subsystems such as host subsystem 20. Imaging system 10 may include camera module 12. Camera module 12 may include one or more image sensor packages 14 (sometimes referred to as image sensors 14) and one or more lenses.

Each image sensor in camera module 12 may be identical or there may be different types of image sensors in a given image sensor array integrated circuit. During image capture operations, each lens may focus light onto an associated image sensor package 14. Image sensor package 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, image sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as buttons, keypads, touch-sensitive areas, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
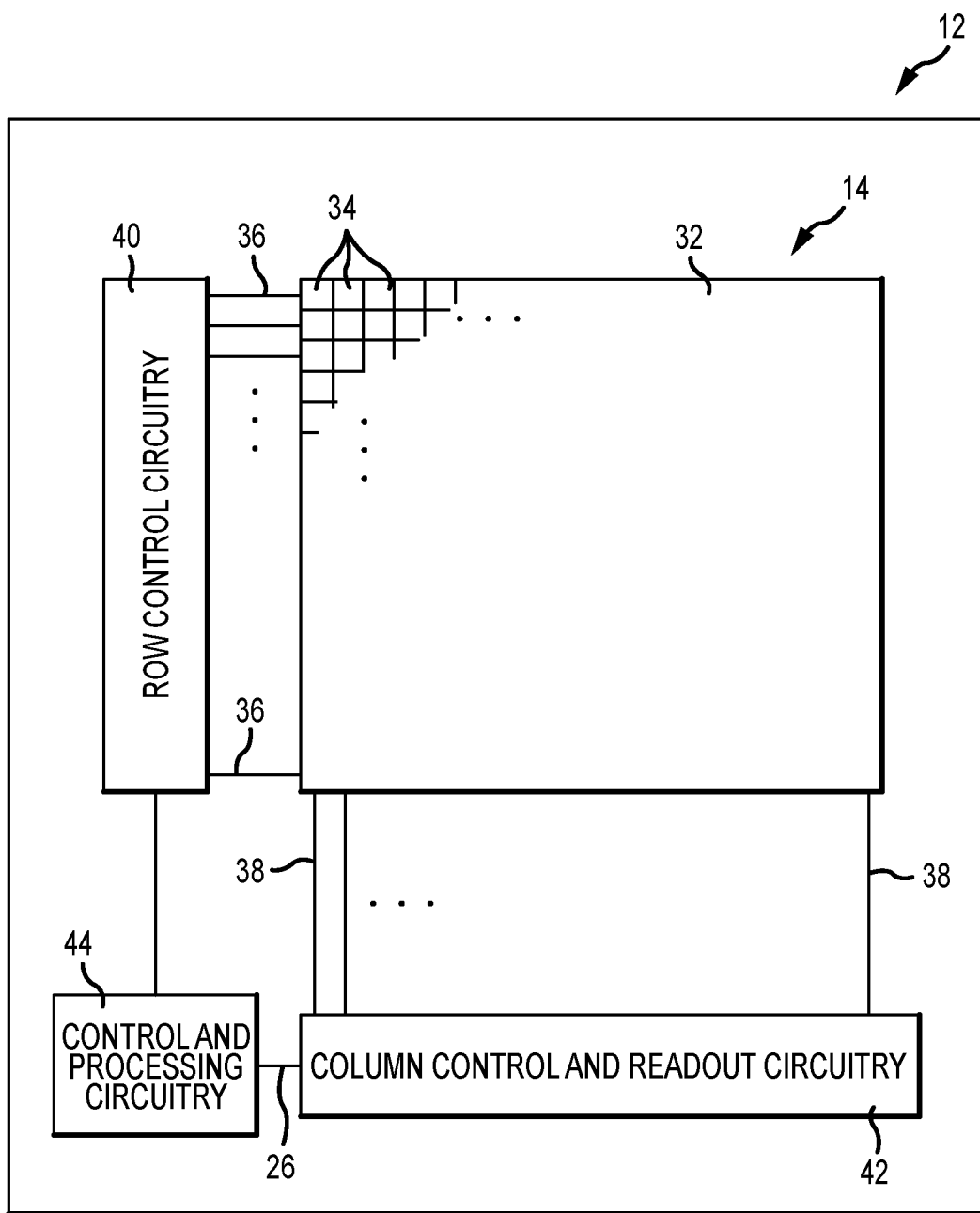
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor package 14 and control and processing circuitry 44. Control and processing circuitry 44 may correspond to image processing and data formatting circuitry 16 in FIG. 1. Image sensor package 14 may include a pixel array such as array 32 of pixels 34 (e.g., formed on one or more image sensor chips in the image sensor package) and may also include control circuitry 40 and 42. Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from pixels 34 (sometimes referred to herein as image sensor pixels, imaging pixels, or image pixels 34) and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, a conductive via, etc.) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

Imaging systems described herein may include tunable polarization filters. Polarization filters in imaging systems may be used to manage reflections, suppress glare, improve performance of the image sensor, etc. Including a tunable polarization filter provides the capability to actively and controllably modulate the polarization of the light received by the image sensor. This may enhance the effectiveness and versatility of polarization imaging, may improve performance of global shutter sensors, may enhance efficiencies of optical switching devices and optical modulation devices, may mitigate flare and glare artifacts, and may be useful for pixel design.

The tunable polarization filter may be integrated directly into an image sensor package. For example, the tunable polarization filter may serve as cover glass for the image sensor package. Integrating tunable polarization filters and image sensor packages in this way is beneficial as it reduces system size and weight and also helps with mitigation of optical losses and image artifacts due to reflections.

Tunable polarization package glass may be incorporated into image sensor packages that have air gaps between the image sensor and the package glass. Tunable polarization package glass may also be incorporated into image sensor packages that have no air gap between the image sensor and the cover glass.

The tunable polarization layer may be controlled at a global level, at a sub-array level, or at a pixel level. When controlled at the global level, the entire tunable polarization layer may be controlled individually (e.g., the entire tunable polarization layer has the same state). The entire image sensor therefore receives light having the same polarization. When controlled at the sub-array level, the tunable polarization layer may be divided into sections that are smaller than the entire image sensor. Each section of the tunable polarization layer may be controlled individually (e.g., the sections of the tunable polarization layer may have different states). Control at the pixel level is a specific case (e.g., a subset) of control at the sub-array level. When controlled at the pixel level, the tunable polarization layer may be divided into sections that each correspond to an individual image sensor pixel. Each section of the tunable polarization layer may be controlled individually to provide the corresponding pixel with light of a desired polarization.

In some cases, the tunable polarization layer may be a tunable polarization filter. In this example, the direction of the polarization filter is tuned. The tunable polarization filter may be switched between a first state in which the optical axis (e.g., the pass axis) of the polarization filter is aligned with the polarization of incoming light and a second state in which the optical axis of the polarization filter is perpendicular to the polarization of incoming light. A linear polarizer may be positioned in front of the tunable polarization filter to ensure that the light reaches the tunable polarization filter with a known polarization. The tunable polarization filter then either passes or blocks the light as desired.

In other cases, the tunable polarization layer may be a tunable polarization rotator. In this example, the tunable polarization layer selectively rotates the polarization of light that passes through the tunable polarization layer. The tunable polarization layer may be switched between a first state in which the polarization of the incident light is not rotated and a second state in which the polarization of the incident light is rotated (e.g., by ninety degrees). A linear polarizer may be positioned in front of the tunable polarization layer to ensure that the light reaches the tunable polarization layer with a known polarization. The tunable polarization filter then either passes the light without modification or rotates the light to have a different, orthogonal polarization. An additional linear polarizer may be positioned below the tunable polarization layer to pass or block the light (based on the state of the tunable polarization layer).

Figure 3:
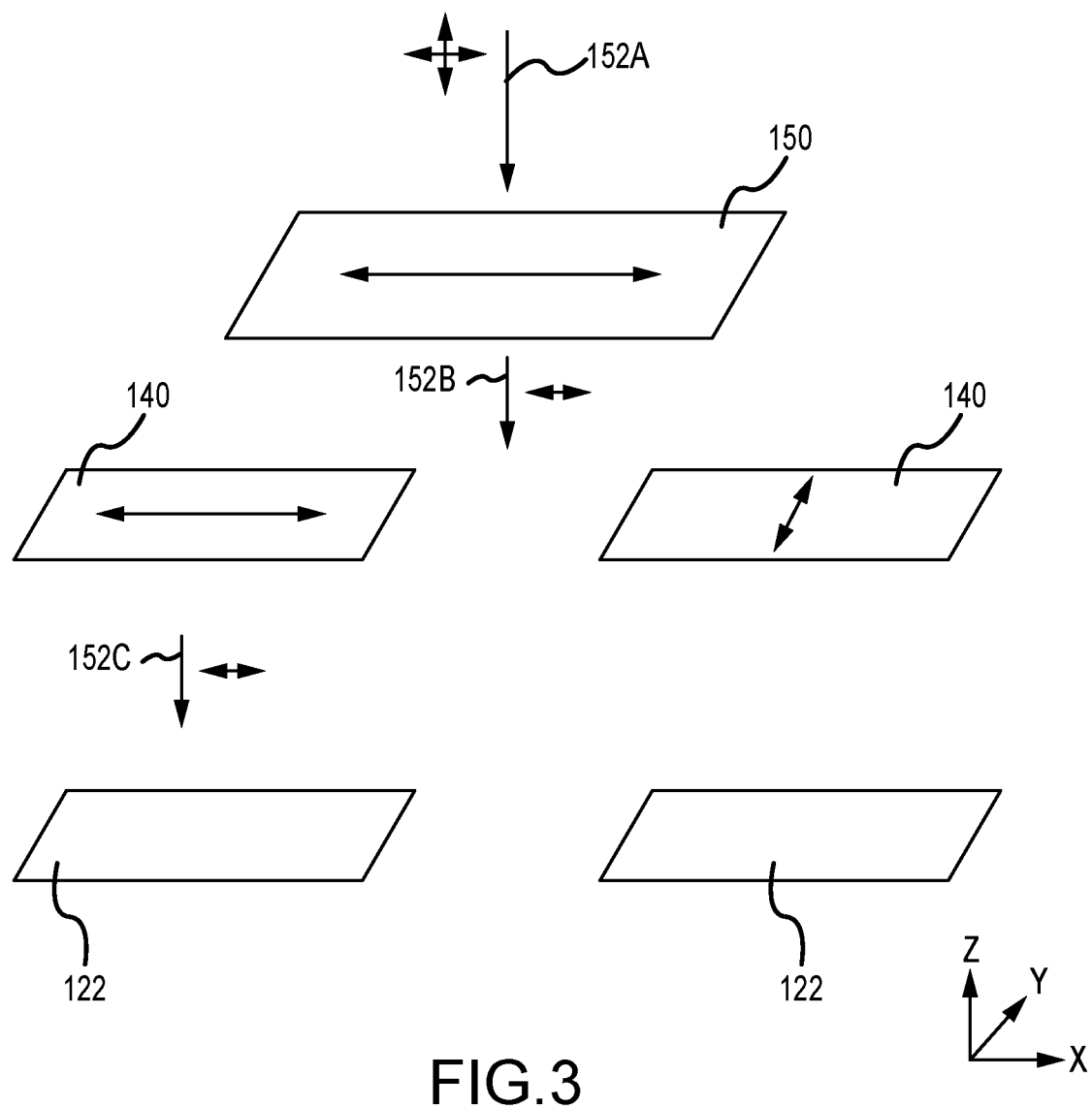
FIG. 3 is a diagram of an illustrative imaging system with a tunable polarization filter in accordance with an embodiment.

FIG. 3 is a schematic diagram showing the operation of an imaging system with a tunable polarization layer that serves as a tunable polarization filter. As shown in FIG. 3, incident light 152A may approach the image sensor package with a mix of polarizations (e.g., 'unpolarized' light). The incident light 152A may pass through a linear polarizer 150 having a pass axis (e.g., an optical axis) that is parallel to the X-axis of FIG. 3. Thus, the light 152B exiting the linear polarizer 150 has a uniform polarization (e.g., parallel to the X-axis). The uniformly polarized light is subsequently provided to a tunable polarization layer 140. In FIG. 3, the tunable polarization layer serves as a tunable polarization filter with a tunable pass axis. The tunable polarization layer may have a first state (on the left) in which the pass-axis is parallel to the X-axis and a second state (on the right) in which the pass-axis is parallel to the Y-axis. On the left, the pass axis of tunable polarization layer 140 is aligned with the polarization of incoming light 152B. Therefore, light 152C passes through the tunable polarization layer 140 to image sensor chip 122 (e.g., one or more semiconductor substrate layers having an array of imaging pixels as shown by array 32 in FIG. 2). On the right, the pass axis of tunable polarization layer 140 is perpendicular to the polarization of incoming light 152B. Therefore, no light passes through the tunable polarization layer 140 to image sensor chip 122.

Figure 4:
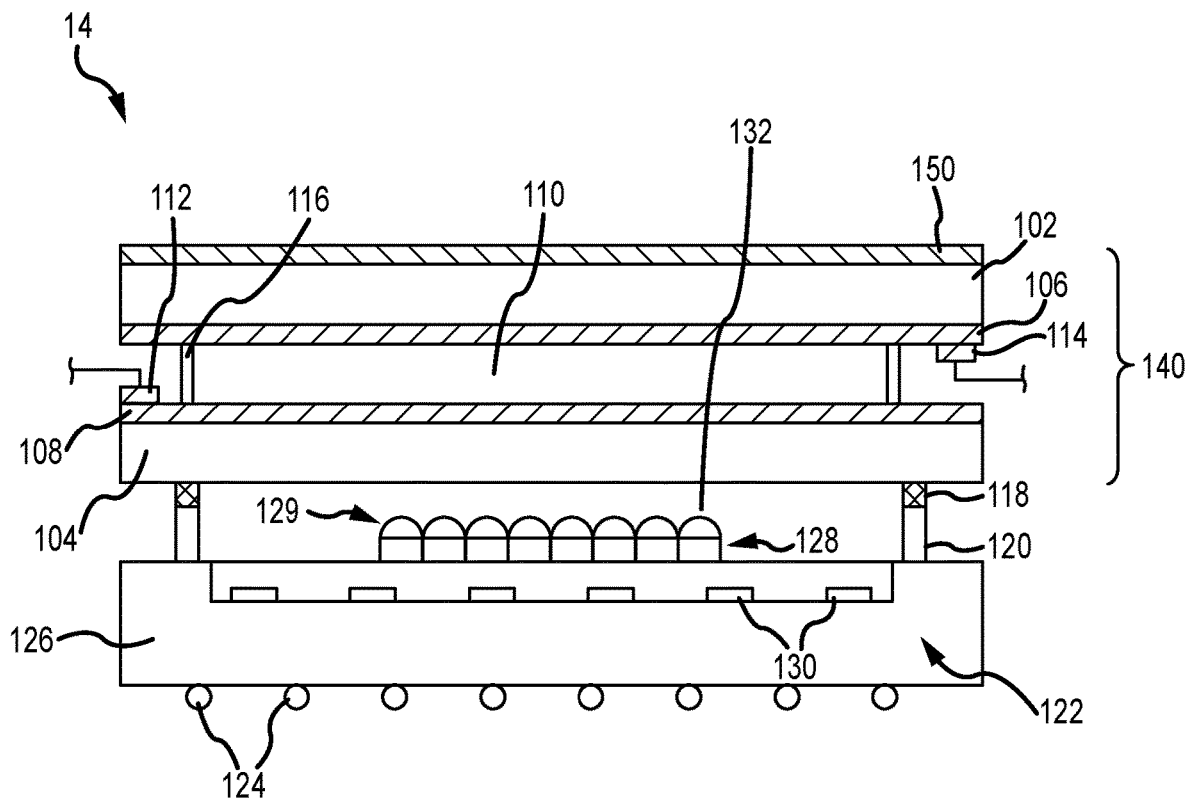
FIG. 4 is a cross-sectional side view of an illustrative image sensor package with a tunable polarization layer that forms a package cover, that is controlled globally, and that is separated from an image sensor die by an air gap in accordance with an embodiment.

FIG. 4 shows an illustrative integrated device 14 (sometimes referred to as an image sensor package 14 or package 14) with an image sensor and a tunable polarization layer. Image sensor package 14 includes image sensor chip 122 that is covered by color filter array (CFA) 128 and microlenses 129 (sometimes collectively referred to as a CFA stack). Each color filter element 128 may cover one pixel (or more than one pixel) of the image sensor chip 122. A respective microlens 129 may cover each color filter element.

Image sensor 122 has bond pads 130. The bond pads 130 may be electrically connected to solder balls 124 (e.g., through vias in substrate 126 as one example). Substrate 126 may be coupled to a dam layer 120. Substrate 126 may sometimes be referred to as a package base. Substrate may be formed from one or more dielectric layers (as one example). Dam layer 120 may be formed from any desired material and may have any desired dimensions. Dams 120 may, for example, be a photodefinable adhesive such as a dry film adhesive that can be applied and patterned using photolithographic techniques. Additional adhesive 118 may optionally be interposed between dam layer 120 and tunable polarization layer 140. In another example, dam layer 120 may be directly attached to tunable polarization layer 140 without intervening adhesive.

Tunable polarization layer 140 (sometimes referred to as tunable polarization cover glass 140, tunable polarization filter 140, tunable polarization device 140, etc.) includes a layer of liquid crystal material 110 that is interposed between transparent substrates 102 and 104 and transparent conductive coatings 106 and 108 that serve as electrodes (and are therefore sometimes referred to as electrodes 106 and 108). Transparent substrates 102 and 104 may be formed from glass or another desired material. Linear polarizer 150 may be formed over transparent substrate 102. Spacer 116 may be used to enclose the liquid crystal material 110. An alignment film (e.g., formed from polyimide) may be formed between one of the electrode layers (e.g., electrode layer 108) and liquid crystal material 110. A first electrode layer 106 may be interposed between liquid crystal layer 110 and glass substrate 102. A second electrode layer 108 may be interposed between liquid crystal layer 110 and glass substrate 104. Transparent conductive layers 106 and 108 may be formed from a transparent conductive oxide (such as indium tin oxide (ITO), aluminum-doped zinc oxide (AZO), etc.), transparent conductive polymer (such as Poly(3,4-ethylenedioxythiophene) (PEDOT)), and/or carbon nanotubes. Liquid crystal layer 110 may be formed from any desired liquid crystal material (e.g., ferroelectric liquid crystals). The liquid crystal layer 110 serves as the switchable layer of tunable polarization layer 140. The example of liquid crystal material being used to form the switchable layer of the tunable polarization layer is also merely illustrative. In general, any material with a controllable optical property (e.g., in response to an electric field) may be used to selectively modify light in the tunable polarization layer.

Electrode layer 106 may be electrically connected to terminal 114 (sometimes referred to as bias voltage supply terminal 114, voltage supply terminal 114, etc.). Electrode layer 108 may be electrically connected to terminal 112 (sometimes referred to as bias voltage supply terminal 112, voltage supply terminal 112, etc.).

Terminals 112 and 114 may be controlled to apply a desired electric field (bias voltage) across liquid crystal layer 110. At a first bias voltage, the liquid crystal layer may pass light of a first polarization (e.g., the known polarization from liner polarizer 150) and block light of a second polarization that is different than (e.g., orthogonal to) the first polarization. At a second bias voltage, the liquid crystal layer may pass light of the second polarization and block light of the first polarization. Since all of the light from the linear polarizer 150 has a uniform polarization, all of the light may be blocked if desired.

In this way, tunable polarization device 140 may be tuned using electrodes 106 and 108. The ability to tune the polarization filter provides increased flexibility in operation of the imaging system. Integrating tunable polarization layer 140 as part of package 14 reduces the size and weight of the imaging system and also helps with mitigation of optical losses and image artifacts due to reflections.

In FIG. 4, tunable polarization device 140 is separated from image sensor 122, color filter array 128, and microlenses 129 by air-filled gap 132. This example is merely illustrative and the air-filled gap may be filled with other material if desired.

In the example of FIG. 4, the tunable polarization device 140 is controlled globally. Electrodes 106 and 108 cover the entire image sensor chip 122. The electrodes may be controlled such that the entire liquid crystal layer is placed in a desired state and all of the light received by the image sensor chip is filtered in the same manner by the tunable polarization layer.

Figure 5:
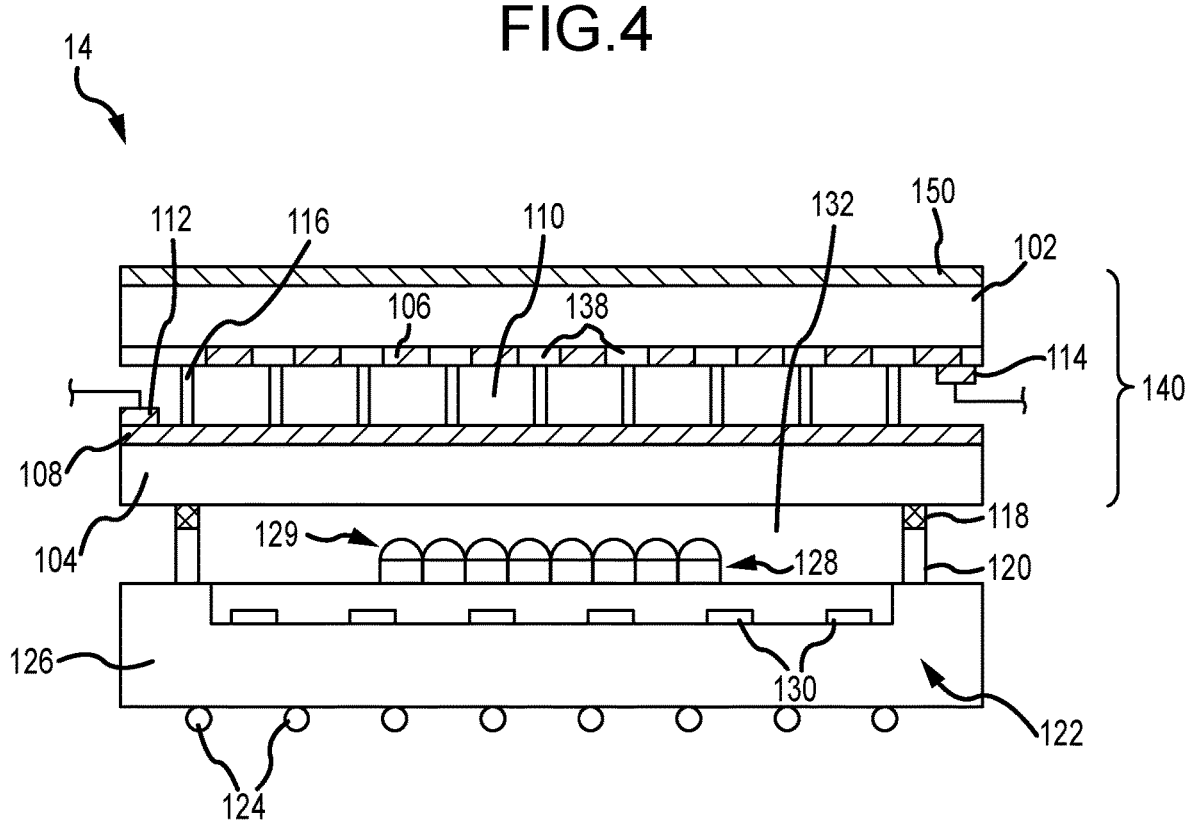
FIG. 5 is a cross-sectional side view of an illustrative image sensor package with a tunable polarization layer that forms a package cover, that is divided into sub-array sized segments, and that is separated from an image sensor die by an air gap in accordance with an embodiment.

This example is merely illustrative. If desired, the tunable polarization package glass may be controlled at a sub-array level or at a per-pixel level. FIG. 5 shows an image sensor package 14 of this type. The package of FIG. 5 is similar to the package of FIG. 4 and the components already described in connection with FIG. 4 will not be described again in connection with FIG. 5.

In FIG. 5, instead of a single continuous conductive structure as in FIG. 4, electrode 106 is divided into electrically isolated sections by insulator 138. The insulator 138 may be formed from any desired material. Similarly, additional spacers 116 may be incorporated to divide liquid crystal layer 110 into isolated sections. Insulators 138 and spacers 116 may be overlapping (e.g., in a grid pattern). Each section of liquid crystal layer 110 (defined by spacers 116) may have a corresponding section of electrode 106 (defined by insulators 138). Each section of the electrode is configured to control its corresponding section of liquid crystal layer 110.

Each individually controllable section of electrode 106 (and liquid crystal layer 110) may overlap less than all of the pixels of image sensor 122 (in a sub-array control scheme) and/or may overlap exactly one pixel of image sensor 122 (in a per-pixel control scheme). Each section of electrode 106 may have a corresponding terminal 114 for controlling the bias voltage applied to that electrode section and corresponding portion of the liquid crystal layer. More than one terminal 114 may be needed to exploit the benefits of a divided electrode 106. Each individually controllable section of electrode 106 (and liquid crystal layer 110) may also be shifted or offset from respective pixels of the image sensor such that a global lens system with a specific chief ray angle causes light to pass at an angle through specific sectors of the tunable polarizer into a designated pixels of the image sensor. Microlenses, color filters and any other light guiding features between the tunable polarizer and the image sensor photodiodes may also likewise be shifted radially in order to maximize the angular acceptance of an image focused through the camera system.

The example of the electrode 106 between liquid crystal material 110 and transparent substrate 102 being divided into electrically isolated sections while electrode 108 remains undivided is merely illustrated. If desired, the inverse arrangement (of a divided electrode 108 and undivided electrode 106) may be used.

In FIG. 5, tunable polarization layer 140 is again separated from image sensor 122, color filter array 128, and microlenses 129 by air-filled gap 132. This example is merely illustrative and the air-filled gap may be filled with other material if desired.

Figure 6:
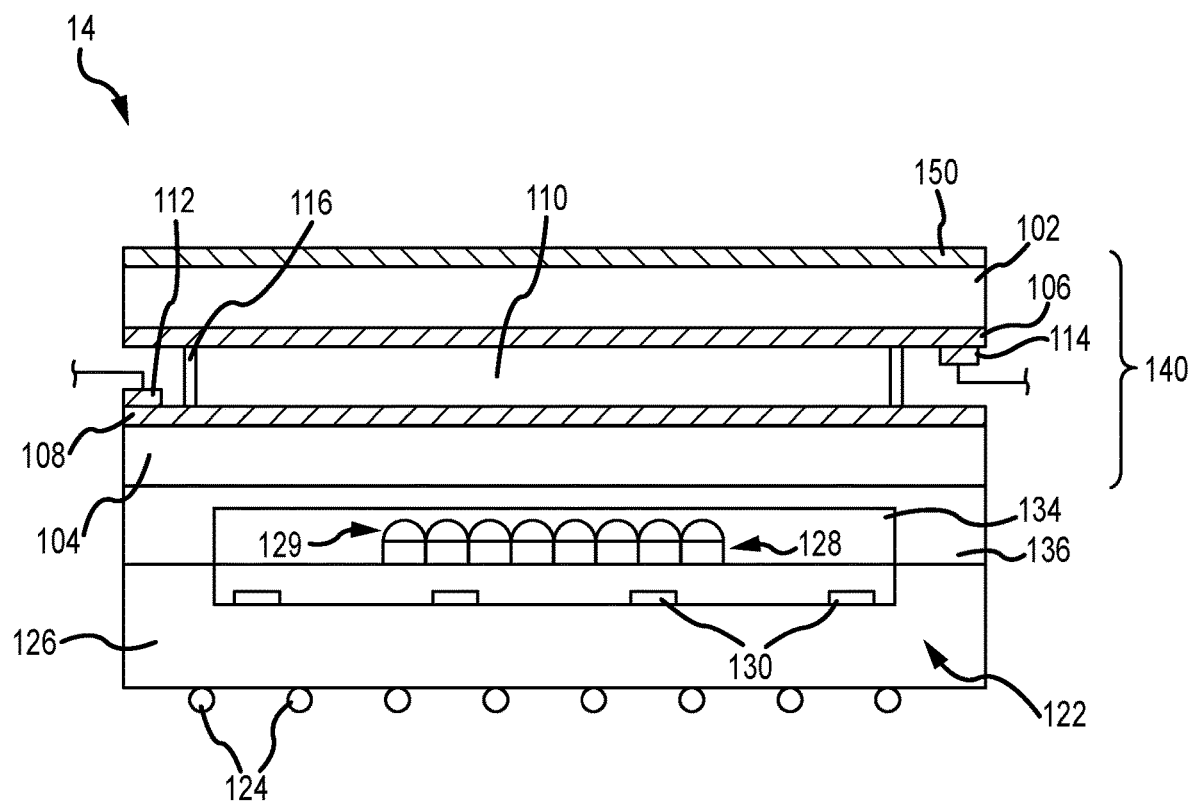
FIG. 6 is a cross-sectional side view of an illustrative image sensor package with a tunable polarization layer that forms a package cover, that is controlled globally, and that is separated from an image sensor die by transparent adhesive in accordance with an embodiment.

FIG. 6 shows an example of an image sensor package without an air-filled gap between image sensor chip 122 and the tunable polarization layer 140. The package of FIG. 6 is similar to the package of FIG. 4 and the components already described in connection with FIG. 4 will not be described again in connection with FIG. 6. Again, there may be shifts or offsets in the radial locations of the sectors or pixel components that optimize the collection of light from the imaged scene onto the photodiodes of each pixel. These parameters are optimized based on the chief ray angle of the focusing lens and on the distances of each component in the z-axis of the system.

In FIG. 6, a package 14 is shown that has no air gap between microlenses 129 and color filter array 128 and tunable polarization layer 140. As shown, transparent adhesive layer 136 may be interposed between tunable polarization layer 140 and microlenses 129 and color filter array 128 (sometimes collectively referred to as a color filter stack). In some embodiments, transparent adhesive layer 136 may directly contact both glass substrate 104 of the tunable polarization layer and the microlenses 129 formed over image sensor 122. However, an additional low-index layer 134 may optionally be included over the color filter stack. As shown in FIG. 6, low-index layer 134 may cover the color filter stack and image sensor chip 122. The transparent adhesive 136 is accordingly in direct contact with substrate glass 104 and the low-index layer 134. Including low-index layer 134 in package 14 may increase an index-of-refraction difference between microlenses and the surrounding material to allow the microlenses to better focus light. Low-index layer 134 may have a lower index-of-refraction than microlenses 129 and/or adhesive layer 136. The index-of-refraction of low-index layer 134 may be less than 1.5, less than 1.4, less than 1.3, less than 1.2, less than 1.1, etc.

As shown in FIG. 6, the tunable polarization layer 140 of FIG. 6 may be controlled globally. Alternatively, the tunable polarization layer 140 of FIG. 6 may be controlled at the sub-array and/or per-pixel level similar to as in FIG. 5.

Figure 7:
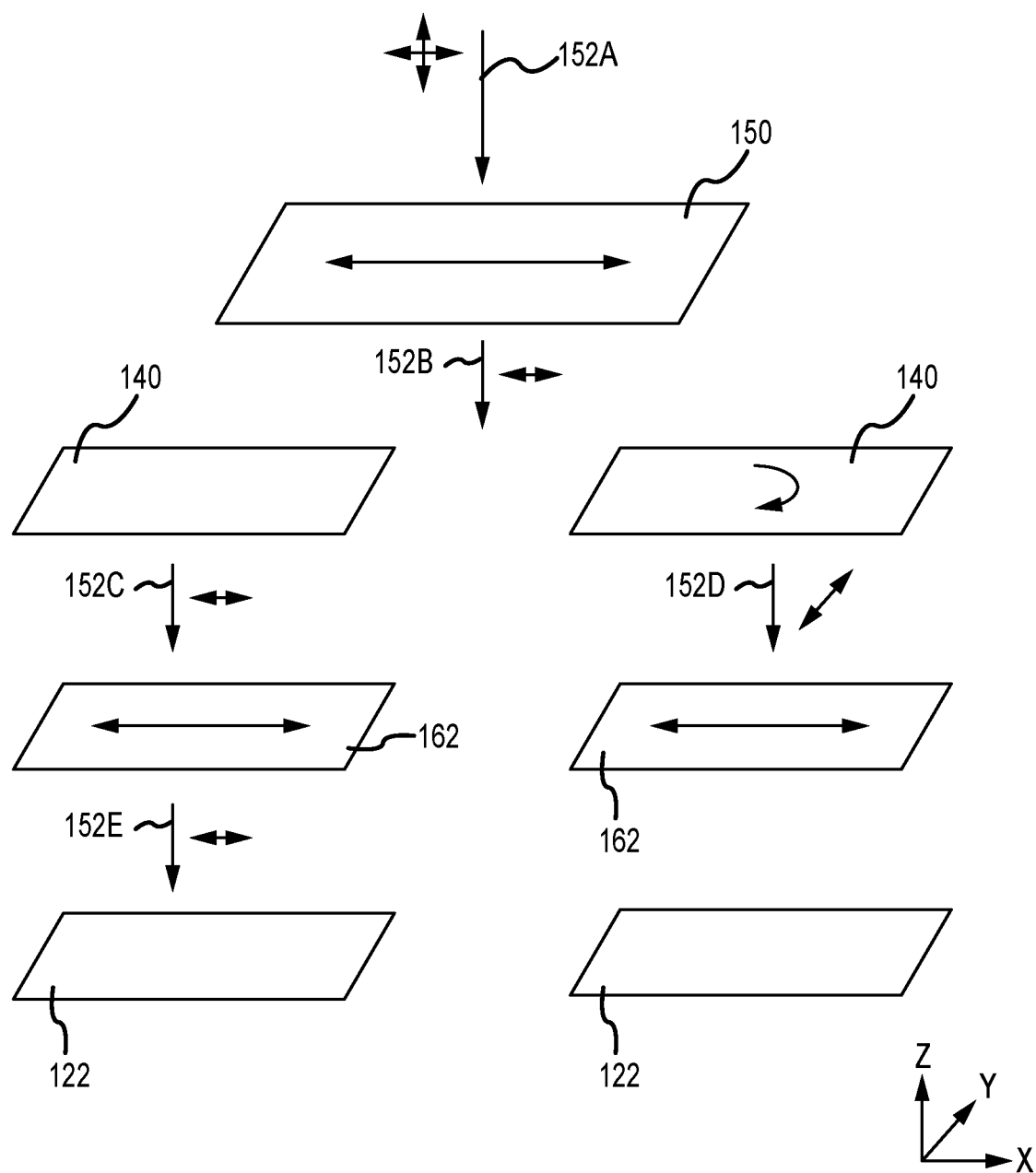
FIG. 7 is a diagram of an illustrative imaging system with a tunable polarization rotator in accordance with an embodiment.

FIG. 7 is a schematic diagram showing the operation of an imaging system with a tunable polarization layer that serves as a tunable polarization rotator. As shown in FIG. 7, incident light 152A may approach the image sensor package with a mix of polarizations (e.g., 'unpolarized' light). The incident light 152A may pass through a linear polarizer 150 having a pass axis that is parallel to the X-axis of FIG. 7. Thus, the light 152B exiting the linear polarizer 150 has a uniform polarization (e.g., parallel to the X-axis). The uniformly polarized light is subsequently provided to a tunable polarization layer 140. In FIG. 7, the tunable polarization layer serves as a tunable polarization rotator that selectively rotates the polarization of the light. The tunable polarization layer may have a first state (on the left) in which light passes through the tunable polarization layer unchanged and a second state (on the right) in which the polarization of light that passes through the tunable polarization layer is rotated. On the left, the light 152C that passes through the tunable polarization layer therefore has a polarization axis that is parallel to the X-axis. On the right, the light 152D that passes through the tunable polarization layer therefore has a polarization that is parallel to the Y-axis (e.g., an orthogonal polarization as light 152B). The light from the tunable polarization layer may then reach an additional linear polarizer 162. In the example of FIG. 7, linear polarizer 162 has a pass axis (e.g., an optical axis) that is parallel to the X-axis (e.g., parallel to the pass axis of linear polarizer 150). Therefore, light 152C (on the left) passes through linear polarizer 162. Light 152E from linear polarizer 162 then reaches image sensor die 122. In contrast, light 152D (on the right) is blocked by linear polarizer 162 and does not reach image sensor die 122.

In the example of FIG. 7, linear polarizer 162 has an optical axis that is parallel to the axis of linear polarizer 150. Therefore, light that is not rotated by tunable polarization layer 140 passes through linear polarizer 162 and light that is rotated by tunable polarization layer is blocked by linear polarizer 162. This example is merely illustrative. If desired, the linear polarizer 162 may have an optical axis that is orthogonal to the optical axis of polarizer 150. In this type of arrangement, light that is rotated by tunable polarization layer 140 passes through linear polarizer 162 and light that is not rotated by tunable polarization layer is blocked by linear polarizer 162.

Figure 8:
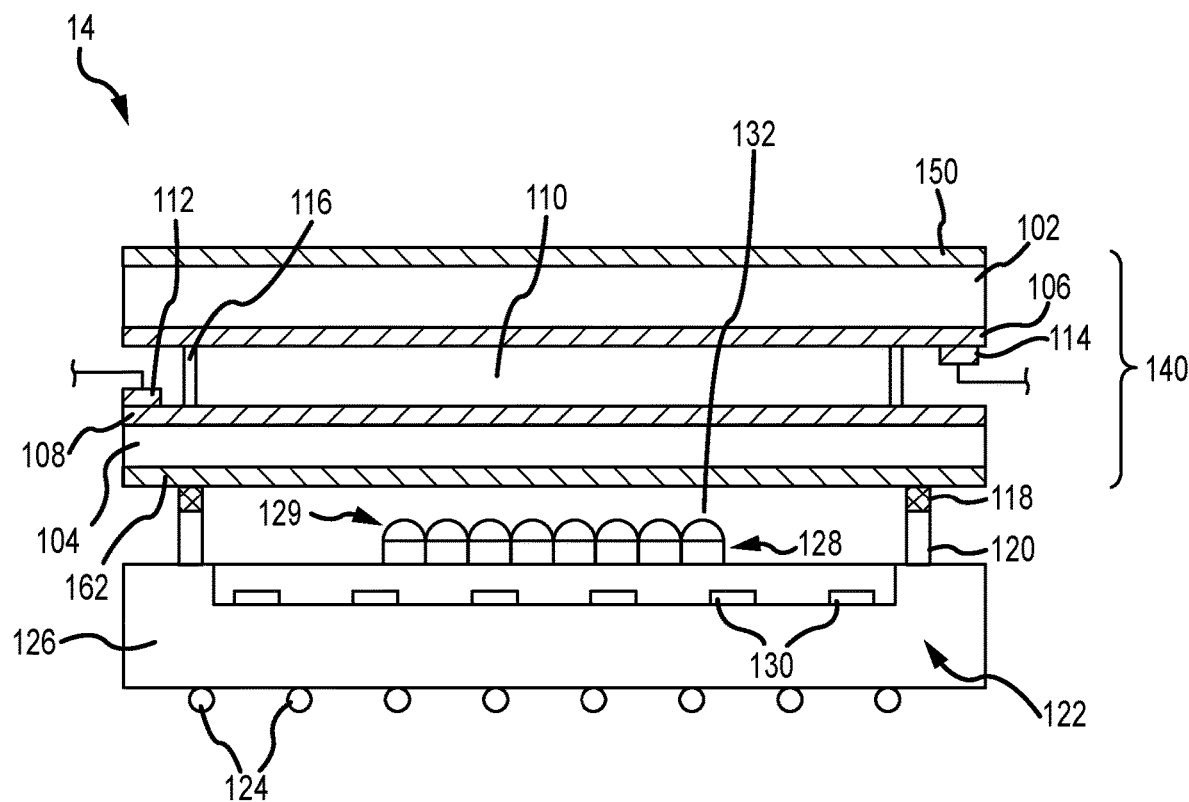
FIG. 8 is a cross-sectional side view of an illustrative image sensor package with a tunable polarization rotator in accordance with an embodiment.

FIG. 8 shows an illustrative image sensor package 14 that includes a tunable polarization rotator (as shown and discussed in connection with FIG. 7). The package of FIG. 8 is similar to the package of FIG. 4 and the components already described in connection with FIG. 4 will not be described again in connection with FIG. 8.

As shown in FIG. 8, image sensor package 14 includes an additional linear polarizer 162 that is interposed between transparent substrate 104 and adhesive 118. The package therefore includes a linear polarizer 150, tunable polarizer layer 140 for selectively rotating the polarization of the light, and linear polarizer 162 for passing the light to the image sensor die or blocking the light.

Terminals 112 and 114 may be controlled to apply a desired electric field (bias voltage) across liquid crystal layer 110. At a first bias voltage, the liquid crystal layer may not rotate the polarization of incident light. At a second bias voltage, the liquid crystal layer may rotate the polarization of incident light (e.g., by ninety degrees). Intermediate bias voltages may also be used to rotate the incident light polarization by intermediate amounts.

In this way, tunable polarization device 140 may be tuned using electrodes 106 and 108. The ability to tune the polarization filter provides increased flexibility in operation of the imaging system. Integrating tunable polarization layer 140 as part of package 14 reduces the size and weight of the imaging system and also helps with mitigation of optical losses and image artifacts due to reflections.

In FIG. 8, the tunable polarization package glass is controlled globally. This example is merely illustrative. If desired, the tunable polarization package glass may instead be controlled at a sub-array level and/or at a per-pixel level. In other words, liquid crystal layer 110 and electrode 106 may be segmented into discrete, individually controllably portions as shown in connection with FIG. 5.

Similarly, the example in FIG. 8 of there being an air gap between the image sensor die 122 and polarizer 162 is merely illustrative. A transparent adhesive layer may be interposed between polarizer 162 and microlenses 129 and color filter array 128, similar to as shown in connection with FIG. 6. In some embodiments, the transparent adhesive layer may directly contact both polarizer 162 and the microlenses formed over image sensor 122. However, an additional low-index layer may optionally be included over the color filter stack, similar to as shown in FIG. 6. The transparent adhesive may accordingly be in direct contact with polarizer 162 and the low-index layer 134. Including the low-index layer in package 14 may increase an index-of-refraction difference between microlenses and the surrounding material to allow the microlenses to better focus light.

In the examples of FIGS. 4-6 and 8, linear polarizer 150 is formed directly on the transparent substrate 102 of the image sensor package. This may improve alignment of the linear polarizer relative to the tunable polarization layer compared to an arrangement where linear polarizer 150 is formed external to the image sensor package. However, depending upon the particular design of the imaging system, linear polarizer 150 may optionally be formed externally to the image sensor package (e.g., the linear polarizer may not be directly attached to the image sensor package and may instead be incorporated into a lens stack above the image sensor package).

In FIGS. 4-6 and 8, substrate 126, dam 120, adhesive 118, image sensor die 122, and tunable polarization layer 140 may collectively be referred to as an integrated image sensor with a tunable polarization layer or an image sensor package. Tunable polarization layer 140 forms the cover (sometimes referred to as a wall) for the image sensor package. Substrate 126 may be referred to as forming a base or wall for the image sensor package. Dam 120 and adhesive 118 may be referred to as forming walls for the image sensor package. Instead of simply a transparent substrate forming the cover of the package, the transparent polarization layer 140 (and one or more accompanying polarizers) forms the cover of the package. This example, however, is merely illustrative. In an alternate arrangement, the tunable polarization layer may be incorporated into the CFA stack.

Figure 9:
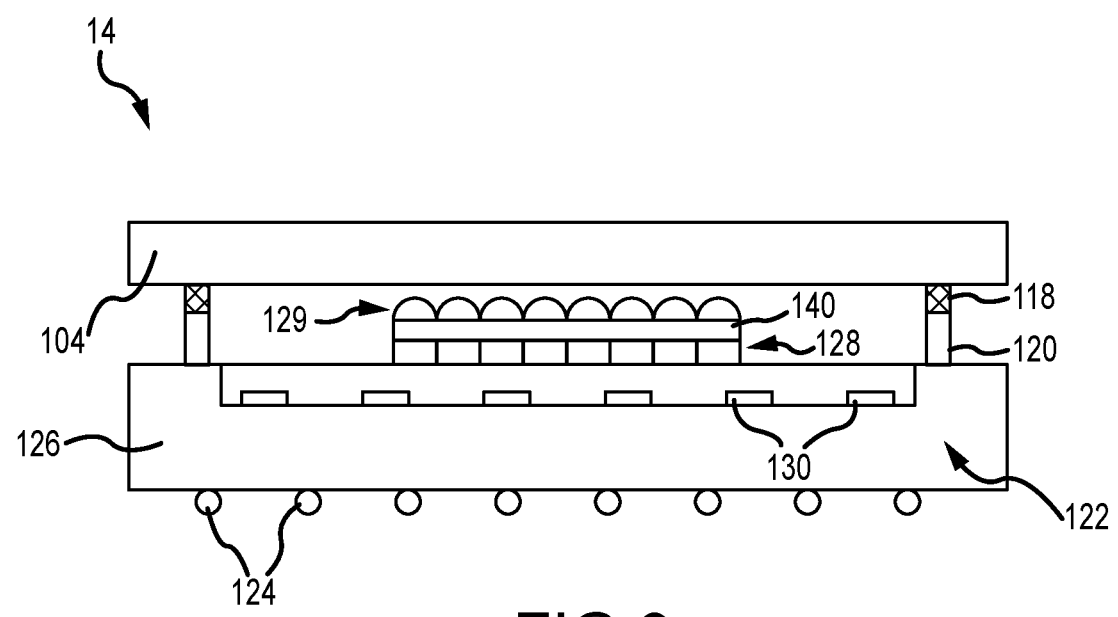
FIG. 9 is a cross-sectional side view of an illustrative image sensor package with a tunable polarization layer interposed between pixel microlenses and a color filter array in accordance with an embodiment.

FIG. 9 is a cross-sectional side view of an illustrative image sensor package with a tunable polarization layer formed underneath microlenses for the pixel array. As shown in FIG. 9, similar to the previous examples, image sensor package 14 includes image sensor chip 122 that is covered by color filter array (CFA) 128 and microlenses 129 (sometimes collectively referred to as a CFA stack). Each color filter element 128 may cover one pixel (or more than one pixel) of the image sensor chip 122. A respective microlens 129 may cover each color filter element.

Additionally, as shown in FIG. 9, the tunable polarization layer 140 may be interposed between color filter array 128 and microlenses 129. This example is merely illustrative, and the tunable polarization layer may instead be formed above the CFA stack. The tunable polarization layer may have any of the arrangements described in connection with FIGS. 4-6 and 8. In other words, the tunable polarization layer of FIG. 9 may serve as a tunable polarization filter or may serve as a tunable polarization rotator. The tunable polarization layer of FIG. 9 may be controlled globally or at a sub-array and/or per-pixel level. In one example, the tunable polarization layer may have an array of portions, with each individually controllable portion corresponding to a respective pixel in the underlying image sensor die.

Image sensor 122 has bond pads 130. The bond pads 130 may be electrically connected to solder balls 124 (e.g., through vias in substrate 126 as one example). Substrate 126 may be coupled to a dam layer 120. Dam layer 120 may be formed from any desired material and may have any desired dimensions. Dams 120 may, for example, be a photodefinable adhesive such as a dry film adhesive that can be applied and patterned using photolithographic techniques. Adhesive 118 may be interposed between dam layer 120 and transparent substrate 104 (e.g., a glass or polymer layer).

The example of the tunable polarization layer 140 being interposed between microlenses 129 and color filter array 128 is merely illustrative. If desired, the tunable polarization layer may instead be positioned between color filter array 128 and image sensor die 122 or at any other desired position within the image sensor package. Additionally, one or more linear polarizers may be adjacent to tunable polarization layer 140 (e.g., as shown in FIGS. 4-6 and 8).

In the examples of FIGS. 3-9, the passive and active components of the image sensor package have uniform optical properties. In other words, the passive components such as linear polarizers 150 and 162 have the same optical axis direction across the entire area of the polarizer. The active component (e.g., liquid crystal layer) may also have the same optical properties throughout (even when the liquid crystal layer may be controlled at a sub-array and/or per-pixel level). However, this need not be the case. In some arrangements, the optical properties of the passive and/or active components may vary across the image sensor. For example, linear polarizers 150 and/or 162 may have different pass axis orientations at different locations within the polarizer.

There are numerous benefits to using the image sensor packages of FIGS. 3-9 in imaging systems. These types of arrangements may increase array resolution in polarization imaging applications because each pixel can have two polarization states, may minimize crosstalk in polarization imaging, may be beneficial for optical switching and optical modulation devices, and may mitigate stray light and reflection artifacts. Additionally, controlling the polarization state of light that is provided to the imaging pixels may be helpful for optimizing the design of the imaging pixels. Additionally, the control of light using such a liquid crystal layer can be used to improve dynamic range in the sensor.

The image sensor packages of FIGS. 3-9 may also improve global shutter efficiency of global shutter sensors and, more importantly, of electronic rolling shutter (ERS) sensors when operated in global reset release shutter (GRR) mode or another mode that tries to achieve global shutter operation with ERS sensors. The tunable polarization layer of FIGS. 3-9 may serve as an optical shutter that blocks incident light from reaching the underlying imaging pixel array. In global shutter image sensors, an optically blocked charge storage region formed separately from the pixel photodiode may be used to store charge until row-by-row readout is performed. ERS sensors do not include a storage node, which is advantageous to minimize pixel size. They can be operated in a mode that resembles global shutter operation if timing is controlled to ensure that all pixels are integrating during the same period of time. However, without a mechanism that prevents light from reaching the image plane during times when some pixels are integrating but others are not, one should expect to obtain artifacts, such as motion artifacts and gradual change in brightness with row order. The optical shutter functionality enabled by the tunable polarization layer of FIGS. 3-9 may allow mitigation of these types of artifacts if the optical shutter is synchronized with the ERS sensor operation to allow light to reach the image plane only when all pixels are integrating.

The image sensor packages of FIGS. 3-9 may also be useful in LIDAR (light detection and ranging) applications. LIDAR systems may use a laser to provide light of a known polarization. Information on the polarization state of the returning pulse may be beneficial to construct a depth map of the captured scene.

The foregoing is merely illustrative of the principles of this invention and various modifications can be made by those skilled in the art. The foregoing embodiments may be implemented individually or in any combination.

What is claimed is:

1. An imaging system comprising:
   a substrate;
   an image sensor having an array of imaging pixels formed on the substrate and microlenses formed over the array of imaging pixels;
   a tunable polarization layer that covers the image sensor, wherein the tunable polarization layer and the substrate form a package for the image sensor;
   transparent adhesive formed between the substrate and the tunable polarization layer; and
   a low-index layer formed between the microlenses and the transparent adhesive.

2. The imaging system defined in claim 1, wherein the tunable polarization layer comprises a layer of liquid crystal material.

3. The imaging system defined in claim 2, wherein the tunable polarization layer comprises first and second electrodes and wherein the layer of liquid crystal material is interposed between the first and second electrodes.

4. The imaging system defined in claim 3, wherein the tunable polarization layer comprises first and second transparent substrates, wherein the first electrode is interposed between the layer of liquid crystal material and the first transparent substrate, and wherein the second electrode is interposed between the layer of liquid crystal material and the second transparent substrate.

5. The imaging system defined in claim 4, further comprising a linear polarizer formed on the first transparent substrate, wherein the layer of liquid crystal material is interposed between the linear polarizer and the image sensor.

6. The imaging system defined in claim 5, further comprising:
a dam attached to the substrate; and
adhesive that couples the dam to the second transparent substrate.

7. The imaging system defined in claim 4, further comprising:
a first linear polarizer formed on the first transparent substrate, wherein the layer of liquid crystal material is interposed between the first linear polarizer and the image sensor; and
a second linear polarizer formed between the layer of liquid crystal material and the image sensor.

8. The imaging system defined in claim 7, further comprising:
a dam attached to the substrate; and
adhesive that couples the dam to the second linear polarizer.

9. The imaging system defined in claim 4, wherein the image sensor is formed on an upper surface of the substrate, the imaging system further comprising:
a plurality of solder balls on a lower surface of the substrate.

10. The imaging system defined in claim 1, wherein the tunable polarization layer has a continuous, adjustable portion that covers the entire image sensor.

11. The imaging system defined in claim 1, wherein the tunable polarization layer has a plurality of independent segments that each cover a subset of the image sensor.

12. The imaging system defined in claim 1, wherein the tunable polarization layer comprises a tunable polarization filter configured to selectively pass light to the image sensor.

13. The imaging system defined in claim 1, wherein the tunable polarization layer comprises a tunable polarization rotator configured to selectively rotate a polarization of light.

* * * * *